(12) United States Patent
Tsui et al.

(10) Patent No.: US 6,881,665 B1
(45) Date of Patent: Apr. 19, 2005

(54) DEPTH OF FOCUS (DOF) FOR TRENCH-FIRST-VIA-LAST (TFVL) DAMASCENE PROCESSING WITH HARD MASK AND LOW VISCOSITY PHOTORESIST

(75) Inventors: Ting Yiu Tsui, Dallas, TX (US); Stephen Keetai Park, Austin, TX (US); Christian Zistl, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 905 days.

(21) Appl. No.: 09/634,209

(22) Filed: Aug. 9, 2000

(51) Int. Cl.[7] .......................................... H01L 21/4763
(52) U.S. Cl. ...................................... 438/637; 438/638
(58) Field of Search ................................ 438/622, 629, 438/637, 638, 639, 640, 645

(56) References Cited

U.S. PATENT DOCUMENTS 6,319,821 B1 * 11/2001 Liu et al. ..................... 438/636

* cited by examiner

Primary Examiner—Hoai Pham
(74) Attorney, Agent, or Firm—Williams, Morgan & Amerson

(57) ABSTRACT

A method is provided, the method comprising forming a dielectric layer above a structure layer, forming a hard mask layer above the dielectric layer, and forming at least one trench opening and at least one upper portion of a first via opening in the dielectric layer through the hard mask layer. The method also comprises forming a low viscosity photoresist layer above the at least one trench opening and the at least one upper portion of the first via opening in the dielectric layer.

20 Claims, 3 Drawing Sheets

DEPTH OF FOCUS (DOF) FOR TRENCH-FIRST-VIA-LAST (TFVL) DAMASCENE PROCESSING WITH HARD MASK AND LOW VISCOSITY PHOTORESIST

BACKGROUND OF THE INVENTION

1. Field of the Invention

This invention relates generally to semiconductor fabrication technology, and, more particularly, to techniques for filling contact openings and vias with copper, and creating copper interconnections and lines.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects contacting active areas, such as $N^+(P^+)$ source/drain regions and a doped-polycrystalline silicon (doped-polysilicon or doped-poly) gate conductor, and the like. As the size and cross-sectional dimensions of electrical interconnects get smaller, resistance increases and electromigration increases. Increased resistance and electromigration are undesirable for a number of reasons. For example, increased resistance may reduce device drive current and source/drain current through the device, and may also adversely affect the overall speed and operation of the transistor. Additionally, electromigration effects in aluminum (Al) interconnects, where electrical currents actually carry Al atoms along with the current, causing them to electromigrate, may lead to degradation of the Al interconnects, further increased resistance, and even disconnection and/or delamination of the Al interconnects.

The ideal interconnect conductor for semiconductor circuitry will be inexpensive, easily patterned, have low resistivity, and high resistance to corrosion, electromigration, and stress migration. Aluminum (Al) is most often used for interconnects in contemporary semiconductor fabrication processes, primarily because aluminum (Al) is inexpensive and easier to etch than, for example, copper (Cu). However, because aluminum (Al) has poor electromigration characteristics and high susceptibility to stress migration, it is typical to alloy aluminum (Al) with other metals.

As discussed above, as semiconductor device geometries shrink and clock speeds increase, it becomes increasingly desirable to reduce the resistance of the circuit metallization. The one criterion that is most seriously compromised by the use of aluminum (Al) for interconnects is that of conductivity. This is because the three metals with lower resistivities (aluminum has a resistivity of $2.824 \times 10^{-6}$ ohms-cm at 20° C.), namely, silver (Ag) with a resistivity of $1.59 \times 10^{-6}$ ohms-cm (at 20° C.), copper (Cu) with a resistivity of $1.73 \times 10^6$ ohms-cm (at 20° C.), and gold (Au) with a resistivity of $2.44 \times 10^6$ ohms-cm (at 20° C.), fall short in other significant criteria Silver (Ag), for example, is relatively expensive and corrodes easily, and gold (Au) is very costly and difficult to etch. Copper (Cu), with a resistivity nearly on par with silver (Ag), immunity from electromigration, high ductility and high melting point (1083° C. for copper vs. 660° C. for aluminum), fills most criteria admirably. However, copper (Cu) is difficult to etch in a semiconductor environment. As a result of the difficulty in etching copper (Cu), an alternative approach to forming vias and metal lines is used. The damascene approach, both single-damascene and dual-damascene, consisting of etching openings such as trenches in the dielectric for lines and/or vias and creating in-laid metal patterns, is the leading contender for fabrication of sub-0.25 micron (sub-0.25 $\mu L$) design rule copper-metallized circuits.

The conventional dual-damascene copper (Cu) process flow combines intermetal via connection formation with copper (Cu) trench-fill formation by etching a more complex pattern before the formation of a barrier metal layer and copper (Cu) seed layer and before the copper (Cu) trench-fill. The trenches, which define the wider metal lines, are typically etched first, and the vias, which define the narrower interlayer metal interconnects, are typically etched last, in what is known as a trench-first-via-last (TFVL) approach. Overall, the conventional dual-damascene copper (Cu) process flow significantly reduces the number of processing steps as compared to the conventional single-damascene copper (Cu) process flow, and is a preferred method of achieving copper-metallization.

The trench-first-via-last (TFVL) approach is also a preferred process flow, since the trench-first-via-last (TFVL) approach is relatively easier to carry out than an alternative via-first-trench-last (VFTL) approach. However, during the conventional trench-first-via-last (TFVL) approach, the photolithographic patterning for the vias faces the problem that, once the openings for the trenches are formed, the photoresist has varying thickness across the surface of the workpiece.

As shown in FIG. 1, for example, a photoresist layer 150 may have a thickness δ above a trench opening 110, whereas the photoresist layer 150 may have a thickness Δ above an upper portion of a via opening 115. The trench opening 110 and the upper portion of the via opening 115 may both be formed at the same time and may both have a depth τ that may be in a range of approximately 2000 Å–6000 Å, for example. The thickness Δ of the photoresist layer 150 above the trench opening 110 may be about 2.5 times the depth τ of the trench opening 110. However, the thickness Δ of the photoresist layer 150 above the upper portion of the via opening 115 may be about 3.5 times the depth τ of the upper portion of the via opening 115.

The trench opening 110 and the upper portion of the via opening 15 are both formed in a dielectric layer 120. The dielectric layer 120 may be formed above an optional hard mask etch stop layer 130. The optional hard mask etch stop layer 130 may be formed above a copper wire or structure layer 125 adjacent a lower dielectric layer 105. The copper wire or structure layer 125 and the lower dielectric layer 105 may be formed above a structure layer 100 such as a semiconducting substrate.

The trench opening 110 may have a width $\Omega$ that may be in a range of approximately 10000 Å–50000 Å, for example. The upper portion of the via opening 115 is typically narrower than the trench opening 110, by a factor in a range of about 8–50. The upper portion of the via opening 115 may have a width $\omega$ that may be in a range of approximately 1000 Å–6250 Å, for example.

The greater width $\Omega$ of the trench opening 110, as compared to the narrower width $\omega$ of the upper portion of the via opening 115, may lead to the variation in the thickness of the photoresist layer 150, in the conventional trench-first-via-last (TFVL) approach. As shown in FIG. 1, the thickness $\delta$ of the photoresist layer 150 above the trench opening 110 may be about 70% of the thickness $\Delta$ of the photoresist layer 150 above the upper portion of the via opening 115. This variation in the thickness of the photoresist layer 150 may lead to increased problems in subsequent photolithography processes, such as processes that pattern and define further via openings. The variation in the thicknesses of the photoresist layer 150 may lead to different optimal focus settings for various patterned structures. The region of common depth of focus (DOF) is reduced, often to the point where there may be almost no common depth of focus (DOF) left remaining for all the various different features and structures that need to be patterned. This may lead to missing vias, since the photoresist layer 150 may not be sufficiently exposed, due to the lack of a common depth of focus (DOF) because of variation in the thicknesses of the photoresist layer 150, as shown in FIG. 1.

The present invention is directed to overcoming, or at least reducing the effects of, one or more of the problems set forth above.

SUMMARY OF THE INVENTION

In one aspect of the present invention, a method is provided, in which the method comprises forming a dielectric layer above a structure layer, forming a hard mask layer above the dielectric layer, and forming at least one trench opening and at least one upper portion of a first via opening in the dielectric layer through the hard mask layer. The method also comprises forming a low viscosity photoresist layer above the at least one trench opening and the at least one upper portion of the first via opening in the dielectric layer.

In another aspect of the present invention, a device is provided, formed by a method that comprises forming a dielectric layer above a structure layer, forming a hard mask layer above the dielectric layer, and forming at least one trench opening and at least one upper portion of a first via opening in the dielectric layer through the hard mask layer. The method also comprises forming a low viscosity photoresist layer above the at least one trench opening and the at least one upper portion of the first via opening in the dielectric layer.

In yet another aspect of the present invention, a device is provided, the device comprising a structure layer, a dielectric layer above the structure layer, a hard mask layer above the dielectric layer, and at least one trench opening and at least one upper portion of a first via opening in the dielectric layer extending through the hard mask layer. The device also comprises a low viscosity photoresist layer above the at least one trench opening and the at least one upper portion of the first via opening in the dielectric layer.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
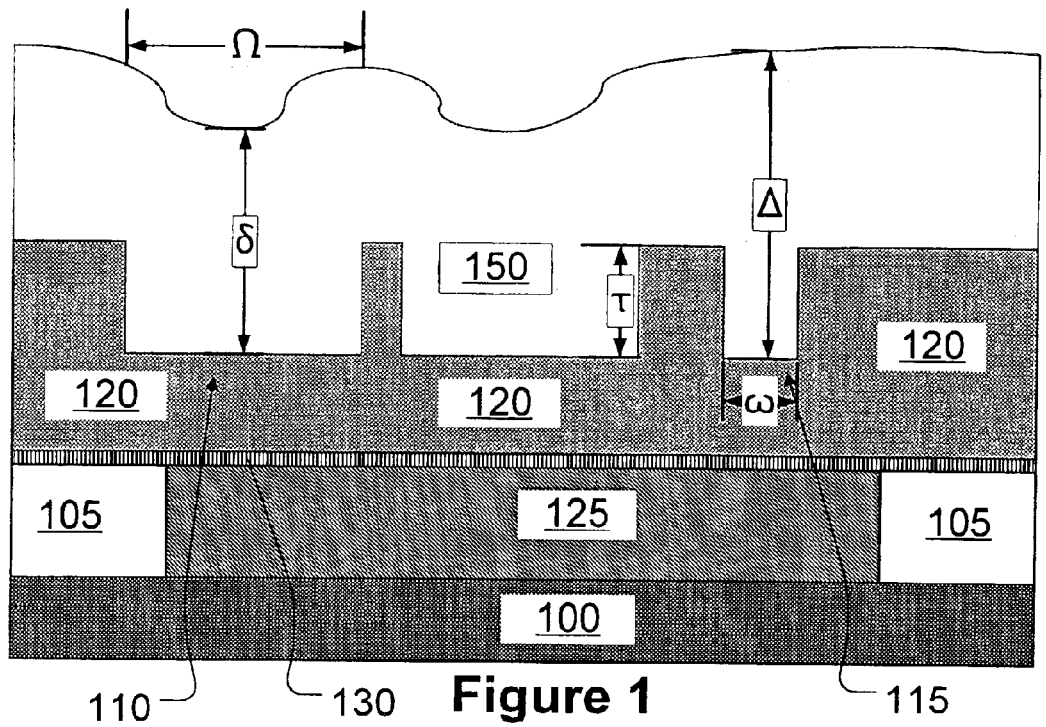
FIG. 1 schematically illustrates a portion of a conventional dual-damascene process flow.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 2–6. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are comprised to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, comprising, but not limited to, logic devices, memory devices, and the like.

The trench-first-via-last (TFVL) approach, according to various illustrative embodiments of the present invention, is a preferred process flow, since the trench-first-via-last (TFVL) approach, according to various illustrative embodiments of the present invention, is relatively easier to carry out than a conventional alternative via-first-trench-last (VFTL) approach. However, unlike the conventional trench-first-via-last (TFVL) approaches, the photolithographic patterning for the vias in various illustrative embodiments of a trench-first-via-last (TFVL) approach in accord with the present invention does not face the problem that, once the openings for the trenches are formed, the photoresist has varying thickness across the surface of the workpiece. On the contrary, in various illustrative embodiments of a trench-first-via-last (TFVL) approach in accord with the present invention, once the openings for the trenches are formed, the photoresist has substantially uniform thickness across the surface of the workpiece.

Figure 2:
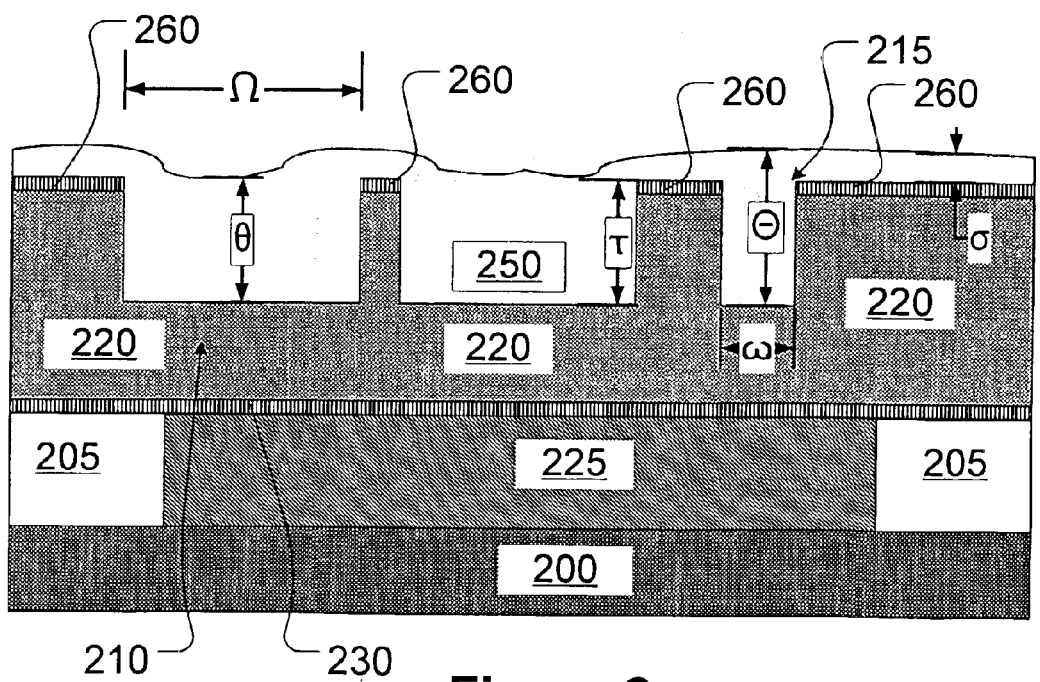
FIGS. 2–4 schematically illustrate portions of a dual-damascene process flow according to various exemplary embodiments of the present invention.
Figure 3:
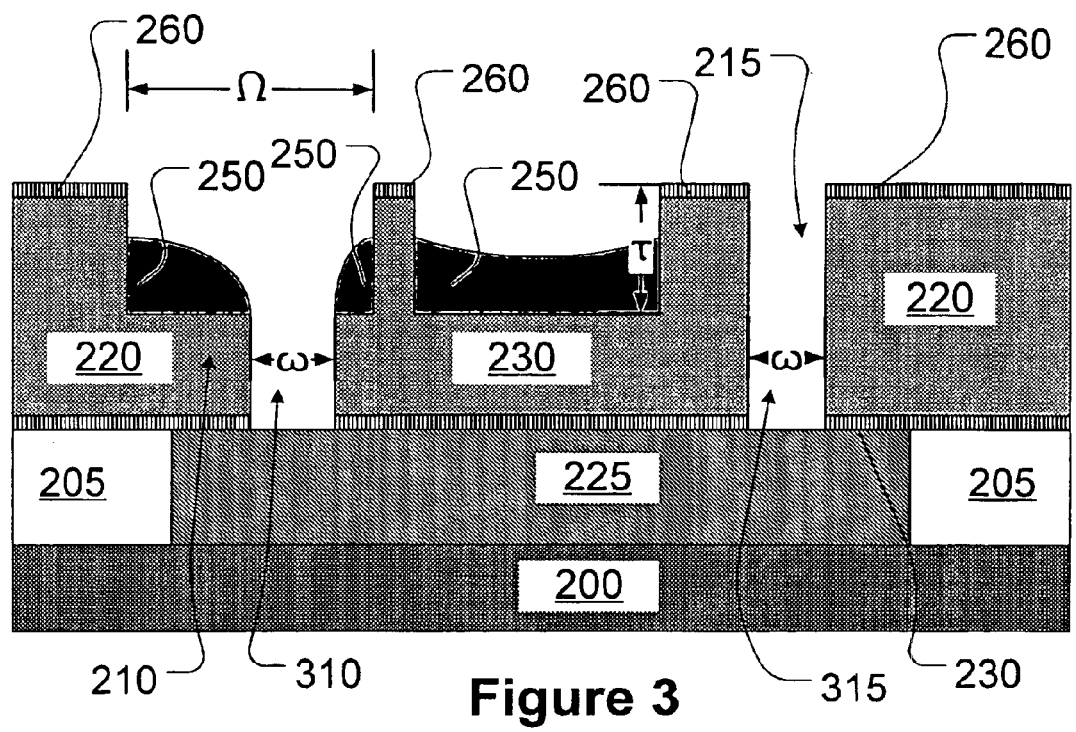

As shown in FIG. 2, for example, a photoresist layer 250 may have a thickness $\theta$ above a trench opening 210, whereas the photoresist layer 250 may have a thickness $\ominus$ above an upper portion 215 of a via opening 315 (FIG. 3). The trench opening 210 and the upper portion 215 of the via opening 315 may both be formed at the same time and may both have a depth $\tau$ that may be in a range of approximately 2000 Å–6000 Å, for example. The thickness $\theta$ of the photoresist layer 250 above the trench opening 210 may be about 1.1 times the depth $\tau$ of the trench opening 210, and at most about 1.5 times the depth $\tau$ of the trench opening 210. Similarly, the thickness $\ominus$ of the photoresist layer 250 above the upper portion 215 of the via opening 315 may be about 1.3 times the depth $\tau$ of the upper portion of the via opening 215, and at most about 1.5 times the depth $\tau$ of the upper portion 215 of the via opening 315. The thickness $\sigma$ of the photoresist layer 250 above a hard mask etch stop layer 260 above a dielectric layer 220 may be at most about 0.5 times the depth $\tau$ of the trench opening 210 and of the upper portion 215 of the via opening 315.

In various illustrative embodiments of a trench-first-via-last (TFVL) approach, according to the present invention, a low viscosity photoresist may be used to form the photoresist layer 250. Examples of an appropriate low viscosity photoresist, suitable for use in various illustrative embodiments of the present invention, may comprise Shipley's UV 140, Shipley's UV 110, and the like. The appropriate low viscosity photoresist, suitable for use in various illustrative embodiments of the present invention, may have a viscosity in a range of about 0.1 to about 0.3.

The trench opening 210 and the upper portion 215 of the via opening 315 are both formed in the dielectric layer 220. The dielectric layer 220 may be formed above an optional hard mask etch stop layer 230. The optional hard mask etch stop layer 230 may be formed above a copper wire or structure layer 225 adjacent a lower dielectric layer 205. The copper wire or structure layer 225 and the lower dielectric layer 205 may be formed above a structure layer 200 such as a semiconducting substrate. However, the present invention is not limited to the formation of the copper wire or structure layer 225 and the lower dielectric layer 205 above the surface of the semiconducting substrate 200 such as a silicon wafer, for example. Rather, as will be apparent to one skilled in the art upon a complete reading of the present disclosure, the copper wire or structure layer 225 and the lower dielectric layer 205 formed in accordance with the present invention may be formed above previously formed semiconductor devices and/or process layer, e.g., transistors, or other similar structure. In effect, the present invention may be used to form process layers on top of previously formed process layers. The structure layer 200 may be an underlayer of semiconducting material, such as a silicon substrate or wafer, or, alternatively, may be an underlayer of semiconductor devices (see FIG. 6, for example), such as a layer of metal oxide semiconductor field effect transistors (MOSFETs), and the like, and/or a metal interconnection layer or layers (see FIG. 5, for example) and/or an interlayer dielectric (ILD) layer or layers, and the like.

The trench opening 210 may have a width $\Omega$ that may be in a range of approximately 10000 Å–50000 Å, for example. The upper portion 215 of the via opening 315 is typically of the same size as the via opening 315, and can be narrower than the trench opening 210, by a factor in the range of about 8 to about 50. The upper portion 215 of the via opening 315 may have a width $\omega$ that may be in a range of approximately 1000 Å–6250 Å, for example.

As shown in FIG. 2, the use of a low viscosity photoresist in the photoresist layer 250 may lead to only a relatively small variation in the thickness of the photoresist layer 250, despite the greater width $\Omega$ of the trench opening 210, as compared to the narrower width $\omega$ of the upper portion 215 of the via opening 315. As shown in FIG. 2, for example, the thickness $\theta$ of the photoresist layer 250 above the trench opening 210 may be at least about 84% of the thickness $\ominus$ of the photoresist layer 250 above the upper portion 215 of the via opening 315. This reduction in the variation in the thickness of the photoresist layer 250, as compared with conventional trench-first-via-last (TFVL) approached, as shown in FIG. 1, may lead to decreased problems in a subsequent photolithography process that patterns and defines further via openings.

The reduction in the variation in the thickness of the photoresist layer 250 may lead to substantially the same optimal focus settings for various patterned structures. The region of common depth of focus (DOF) is increased, so that there may often be enough common depth of focus (DOF) left remaining for all the various different features and structures that need to be patterned. This may lead to a decrease in the number of missing vias, since the photoresist layer 250 may often be sufficiently exposed. The photoresist layer 250 may often be sufficiently exposed because of the presence of a common depth of focus (DOF) due to the reduced variation in the thickness of the photoresist layer 250, as shown in FIG. 2.

As shown in FIG. 2, the hard mask etch stop layer 260 above the dielectric layer 220 may be used so that an etching process may be used to form further via openings, despite the use of a low viscosity photoresist in the photoresist layer 250. As described above, the thickness a of the photoresist layer 250 above the hard mask etch stop layer 260 above the dielectric layer 220 may be at most about 0.5 times the depth $\tau$ of the trench opening 210 and of the upper portion 215 of the via opening 315. In various illustrative embodiments in which the dielectric layer 220 comprises silicon dioxide ($SiO_2$), the hard mask etch stop layer 260 may comprise silicon nitride (SiN), silicon oxynitride (SiON), and the like. In various alternative illustrative embodiments in which the dielectric layer 220 comprises a low dielectric (low K) material, as described in more detail below, the hard mask etch stop layer 260 may comprise tetraethyl orthosilicate (TEOS), and the like. The hard mask etch stop layer 260 may also be used as an antireflective coating (ARC), thereby eliminating the need for a bottom antireflective coating (BARC). In various illustrative embodiments, the hard mask etch stop layer 260 antireflective coating (ARC) may be removed during a chemical-mechanical planarization (CMP) process, thereby reducing the overall effective dielectric constant ($K_{eff}$) of the resulting interlayer dielectric (ILD) layer, unlike conventional processes that do not typically remove the bottom antireflective coating (BARC).

In various illustrative embodiments, the dielectric layer 220 may be formed by a variety of known techniques for forming such layers, e.g., chemical vapor deposition (CVD), low-pressure CVD (LPCVD), plasma-enhanced CVD (PECVD), sputtering, physical vapor deposition (PVD), thermal growing, spin-on glass, and the like. The dielectric layer 220 may have a thickness in a range of about 7000–20000 Å. In one illustrative embodiment, the dielectric layer 220 is comprised of silicon dioxide ($SiO_2$), having a thickness of approximately 10000 Å, formed by being blanket-deposited by an LPCVD process for higher throughput.

The dielectric layer 220 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The dielectric layer 220 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like.

In various alternative illustrative embodiments, the dielectric layer 220 may be formed from a variety of low dielectric constant (low K) materials, where K (the relative dielectric constant) is less than or equal to about 4. Examples comprise Applied Material's Black Diamond®, Novellus' Coral®, Allied Signal's Nanoglass®, JSR's LKD5104, and the like. In one illustrative embodiment, the dielectric layer 220 is comprised of Applied Material's Black Diamond®, having a thickness of approximately 10000 Å, being formed by being blanket-deposited by an LPCVD process for higher throughput.

As shown in FIG. 3, the low viscosity photoresist layer 250 may be patterned to form via openings 310 and 315, by using photolithography, for example. In various illustrative embodiments, the via openings 310 and 315 may each have a width ω that may be in a range of approximately 1000 Å–6250 Å, for example. The via openings 310 and 315 may be formed by using a variety of known anisotropic etching techniques, such as a reactive ion etching (RIE) process using hydrogen bromide (HBr) and argon (Ar) as the etchant gases, for example. Alternatively, a reactive ion etching (RIE) process with $CHF_3$ and Ar as the etchant gases may be used, for example. Plasma etching may also be used in various illustrative embodiments. The etching may extend through the hard mask etch stop layer 230 and stop at the copper wire or structure layer 225 adjacent the lower dielectric layer 205.

Figure 4:
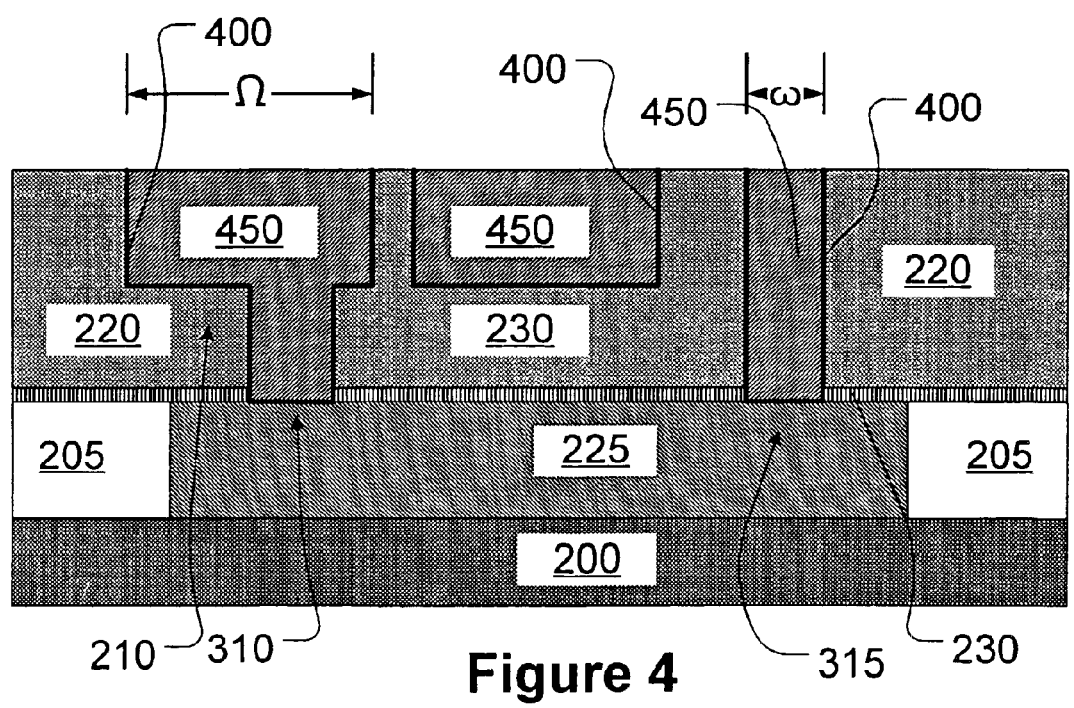

As shown in FIG. 4, the patterned low viscosity photoresist layer 250 is stripped off, by ashing, for example. Alternatively, the patterned low viscosity photoresist layer 250 may be stripped using commercially available cleaning chemicals such as ACT935, EKC265, and the like.

As shown in FIG. 4, one or more thin barrier metal layers and one or more copper seed layers (or seed layer of another conductive material), here represented by heavy line 400, are applied to the entire surface using vapor-phase deposition, and the like. The barrier metal layer(s) and the conductive material (copper) seed layer(s) 400 line the trench opening 210 and the via openings 310 and 315. The barrier metal layer(s) may be formed of at least one layer of a barrier metal material, such as tantalum (Ta) or tantalum nitride (TaN), and the like. For example, the barrier metal layer(s) may also be formed of titanium nitride (TiN), titanium-tungsten (Ti-Ta), nitrided titanium-tungsten (NTi-Ta), magnesium (Mg), or another suitable barrier material.

The conductive material (copper) seed layer(s) may be formed above the one or more barrier metal layer(s) by physical vapor deposition (PVD) or chemical vapor deposition (CVD), for example.

The bulk of the copper trench-fill and via-fill (or trench-fill and via-fill of another conductive material) is frequently done using an electroplating technique. The electroplating technique may use an electrode (not shown) to establish an electrical contact with the barrier metal layer(s) and the conductive material (copper) seed layer(s) 400. The electroplating technique may then proceed by immersing the barrier metal layer(s) and the conductive material (copper) seed layer(s) 400 in an electrolyte solution containing copper (Cu) ions (or ions of another conductive material). An electrical current is then passed through the workpiece (wafer)-electrolyte system to cause reduction and deposition of copper (Cu) ions (or ions of another conductive material) in the trench opening 210 and the via openings 310 and 315. In addition, in various alternative illustrative embodiments, an alternating-current bias of the workpiece (wafer) electrolyte system has been considered as a method of self-planarizing the deposited copper (Cu) film (or film of another conductive material), similar to the deposit-etch cycling used in high-density plasma (HDP) tetraethyl orthosilicate (TEOS) dielectric depositions.

As shown in FIG. 4, conductive (copper) interconnects may be formed by annealing the conductive material (copper) 450 filling the via openings 310 and 315 to the conductive structure 225. The anneal process may be performed in a traditional tube furnace, at a temperature ranging from approximately 100–500° C., for a time period ranging from approximately 1–180 minutes, in a nitrogen-containing ambient that may comprise at least one of ammonia ($NH_3$), molecular nitrogen ($N_2$), molecular hydrogen ($H_2$), argon (Ar), and the like. Alternatively, the anneal process may be a rapid thermal anneal (RTA) process performed at a temperature ranging from approximately 100–500° C. for a time ranging from approximately 10–180 seconds in a nitrogen-containing ambient that may comprise at least one of molecular nitrogen ($N_2$), molecular hydrogen ($H_2$), argon (Ar), and the like.

As shown in FIG. 4, once a sufficiently thick layer of conductive material (copper) 450 has been deposited and annealed, the layer of conductive material (copper) 450 is planarized using chemical-mechanical planarization (CMP) techniques. The planarization using the chemical-mechanical planarization (CMP) process clears all conductive material (copper) 450 and barrier metal layer(s) and the conductive material (copper) seed layer(s) 400 outside of the trench opening 210 and the via openings 310 and 315. The conductive material (copper) 450 and barrier metal layer(s) and the conductive material (copper) seed layer(s) 400 are left remaining only filling the trench opening 210 and the via openings 310 and 315. The planarization using the chemical-mechanical planarization (CMP) process also removes the hard mask etch stop layer 260.

Figure 5:
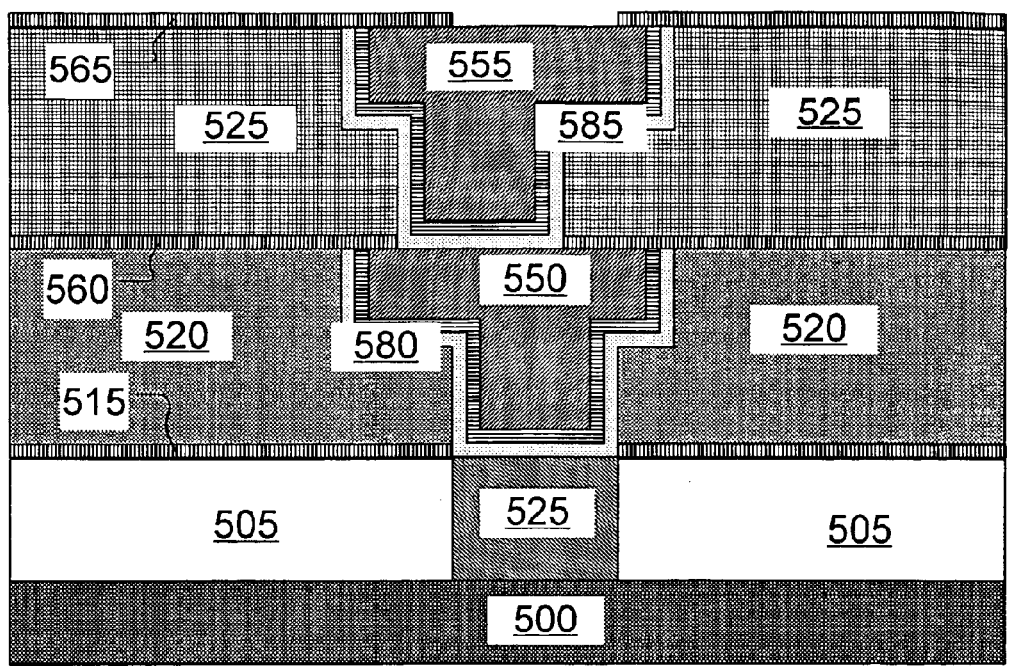
FIG. 5 schematically illustrates multiple layers of copper interconnects according to various exemplary embodiments of the present invention.

As shown in FIG. 5, an interconnect layer 580 (similar to the one shown in FIG. 4) may be an underlying structure layer (similar to the structure layer 200) to an interconnect layer 585 (also similar to the one shown in FIG. 4). In various illustrative embodiments, the interconnect layer 580 may comprise a filled trench-with-via 550 adjacent a planarized dielectric layer 520 and above a hard mask etch stop layer 515 and above an intermetal filled-via connection 525 adjacent a planarized dielectric layer 505. The intermetal filled-via connection 525 may be a conductive (copper) structure similar to the conductive (copper) structure 225

(FIGS. 2–4). The intermetal filled-via connection 525 may be annealed to the filled trench-with-via 550 in a similar fashion to the anneal described above in relation to the conductive material (copper) 450 filling the via openings 310 and 315 (FIG. 4) being annealed to the conductive (copper) structure 225 (FIGS. 2–4). The interconnect layer 580 may also comprise a hard mask etch stop layer 560 formed and patterned above the planarized dielectric layer 520 and above at least a portion of the filled trench-with-via 550.

In various illustrative embodiments, the interconnect layer 585 may comprise a filled trench-with-via 555 adjacent a planarized dielectric layer 525 and above the hard mask etch stop layer 560 and above the filled trench-with-via 550 adjacent the planarized dielectric layer 520 of the interconnect layer 580. The filled trench-with-via 555 may be annealed to the filled trench-with-via 550 in a similar fashion to the anneal described above in relation to the conductive material (copper) 450 filling the via openings 310 and 315 (FIG. 4) being annealed to the conductive (copper) structure 225 (FIGS. 2–4). The interconnect layer 585 may also comprise a hard mask etch stop layer 565 formed and patterned above the planarized dielectric layer 525 and above at least a portion of the filled trench-with-via 555.

Figure 6:
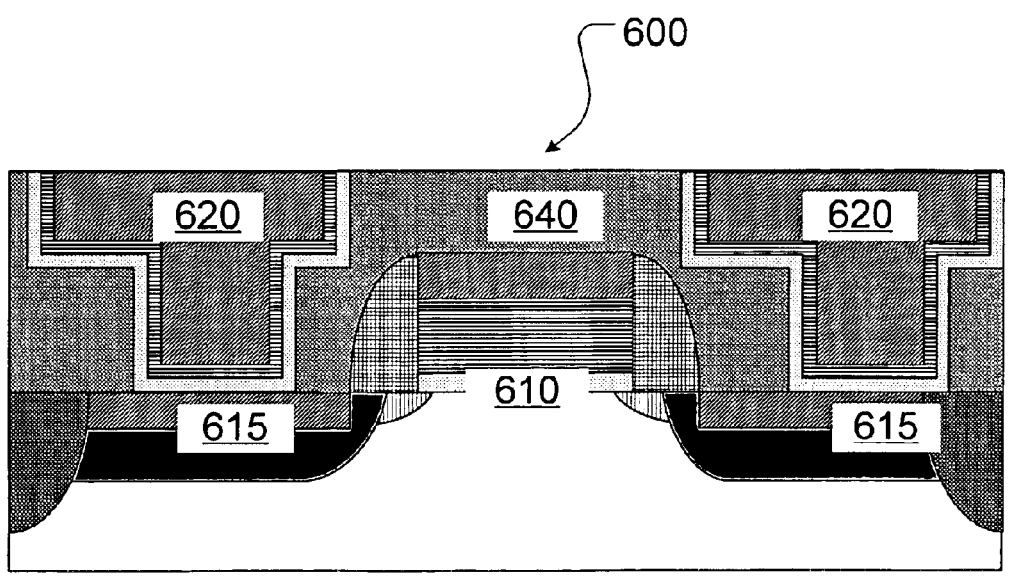
FIG. 6 schematically illustrates copper interconnects according to various exemplary embodiments of the present invention connecting source/drain regions of a metal-oxide-silicon field effect transistor (a MOSFET or a MOS transistor).

As shown in FIG. 6, a metal-oxide-silicon field effect transistor (a MOSFET or a MOS transistor) 610 may be an underlying structure layer (similar to the structure layer 200) to an interconnect layer 600. The interconnect layer 600 may comprise one or more filled trench(es)-with-via(s) 620 adjacent a planarized dielectric layer 640. The one or more filled trench(es)-with-via(s) 620 may be annealed to an underlying conductive structure such as source/drain regions 615 of the metal-oxide-silicon field effect transistor (a MOSFET or a MOS transistor) 610 in a similar fashion to the anneal described above in relation to the conductive material (copper)450 filling the via openings 310 and 315 (FIG. 4) being annealed to the conductive (copper) structure 225 (FIGS. 2–4).

Any of the above-disclosed embodiments of a trench-first-via-last (TFVL) approach is a preferred process flow, since the trench-first-via-last (TFVL) approach, according to various illustrative embodiments of the present invention, is relatively easier to carry out than a conventional alternative via-first-trench-last (VFTL) approach. However, unlike the conventional trench-first-via-last (TFVL) approaches, the photolithographic patterning for the vias in various illustrative embodiments of a trench-first-via-last (TFVL) approach in accord with the present invention does not face the problem that, once the openings for the trenches are formed, the photoresist has varying thickness across the surface of the workpiece. On the contrary, in various illustrative embodiments of a trench-first-via-last (TFVL) approach in accord with the present invention, once the openings for the trenches are formed, the photoresist has substantially uniform thickness across the surface of the workpiece.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A method comprising:
   forming a dielectric layer above a structure layer;
   forming a hard mask layer above the dielectric layer;
   forming at least one trench opening and at least one upper portion of a first via opening in the dielectric layer through the hard mask layer; and
   forming a low viscosity photoresist layer above the at least one trench opening and the at least one upper portion of the first via opening in the dielectric layer.

2. The method of claim 1, further comprising:
   forming a second via opening in the at least one trench opening, the second via opening extending down through the dielectric layer to the structure layer; and
   forming a lower portion of the first via opening in the dielectric layer, the lower portion extending down through the dielectric layer to the structure layer.

3. The method of claim 2, further comprising:
   forming at least one barrier layer above the dielectric layer and in the at least one trench opening and in the first and second via openings;
   forming at least one seed layer above the at least one barrier layer; and
   forming a conductive layer above the at least one seed layer.

4. The method of claim 3, further comprising:
   planarizing the conductive layer, removing the hard mask layer above the dielectric layer.

5. The method of claim 3, wherein forming the conductive layer comprises forming the conductive layer using electrochemical deposition of copper.

6. The method of claim 5, wherein using the electrochemical deposition of the copper comprises planarizing the copper using chemical mechanical polishing after the electrochemical deposition of the copper.

7. The method of claim 1, wherein forming the dielectric layer comprises forming the dielectric layer using a low dielectric constant (low K) dielectric material, having a dielectric constant K of at most about four.

8. The method of claim 1, wherein forming the dielectric layer comprises forming the dielectric layer using at least one of chemical vapor deposition (CVD), low-pressure CVD (LPCVD), plasma-enhanced CVD (PECVD), sputtering, physical vapor deposition (PVD), and spin-on glass.

9. The method of claim 1, wherein forming the hard mask layer above the dielectric layer comprises forming the hard mask layer using at least one of silicon oxynitride and tetraethyl orthosilicate (TEOS).

10. The method of claim 1, wherein forming the hard mask layer above the dielectric layer comprises forming the hard mask layer to be used as an antireflection coating (ARC).

11. A method comprising:
    forming a dielectric layer above a conductive structure;
    forming a hard mask layer above the dielectric layer;
    forming at least one trench opening and at least one upper portion of a first via opening in the dielectric layer through the hard mask layer; and
    forming a low viscosity photoresist layer above the at least one trench opening and the at least one upper portion of the first via opening in the dielectric layer.

12. The method of claim 11, further comprising:

forming a second via opening in the at least one trench opening, the second via opening extending down through the dielectric layer to the conductive structure; and forming a lower portion of the first via opening in the dielectric layer, the lower portion extending down through the dielectric layer to the conductive structure.

13. The method of claim 12, further comprising:

forming at least one barrier layer above the dielectric layer and in the at least one trench opening and in the first and second via openings;

forming at least one seed layer above the at least one barrier layer; and forming a conductive layer above the at least one seed layer.

14. The method of claim 13, further comprising:

planarizing the conductive layer, removing the hard mask layer above the dielectric layer.

15. The method of claim 11, wherein forming the dielectric layer comprises forming the dielectric layer using a low dielectric constant (low K) dielectric material, having a dielectric constant K of at most about four.

16. A method comprising:

forming a dielectric layer above a copper structure;

forming a hard mask layer above the dielectric layer;

forming at least one trench opening and at least one upper portion of a first via opening in the dielectric layer through the hard mask layer; and forming a low viscosity photoresist layer above the at least one trench opening and the at least one upper portion of the first via opening in the dielectric layer.

17. The method of claim 16, further comprising:

forming a second via opening in the at least one trench opening, the second via opening extending down through the dielectric layer to the copper structure; and forming a lower portion of the first via opening in the dielectric layer, the lower portion extending down through the dielectric layer to the copper structure.

18. The method of claim 17, further comprising:

forming at least one barrier layer above the dielectric layer and in the at least one trench opening and in the first and second via openings;

forming at least one copper seed layer above the at least one barrier layer; and forming a copper layer above the at least one copper seed layer.

19. The method of claim 18, further comprising:

planarizing the copper layer, removing the hard mask layer above the dielectric layer.

20. The method of claim 16, wherein forming the dielectric layer comprises forming the dielectric layer using a low dielectric constant (low K) dielectric material, having a dielectric constant K of at most about four.

* * * * *